United States Patent
Nakata

(10) Patent No.: US 9,685,548 B2
(45) Date of Patent: Jun. 20, 2017

(54) HIGH ELECTRON MOBILITY TRANSISTOR AND METHOD OF FORMING THE SAME USING ATOMIC LAYER DEPOSITION TECHNIQUE

(71) Applicant: Sumitomo Electric Industries, Ltd., Osaka-shi (JP)

(72) Inventor: Ken Nakata, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/266,705

(22) Filed: Sep. 15, 2016

(65) Prior Publication Data
US 2017/0077283 A1    Mar. 16, 2017

(30) Foreign Application Priority Data

Sep. 16, 2015   (JP) .................................. 2015-183069

(51) Int. Cl.
*H01L 29/778*   (2006.01)
*H01L 29/66*    (2006.01)

(52) U.S. Cl.
CPC .... *H01L 29/7787* (2013.01); *H01L 29/66462* (2013.01); *H01L 29/778* (2013.01); *H01L 29/7783* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 6,429,467 B1 | 8/2002 | Ando | |
| 2011/0210378 A1* | 9/2011 | Ueno | H01L 29/7783 257/194 |
| 2012/0211801 A1* | 8/2012 | Hashimoto | H01L 29/7785 257/194 |
| 2013/0105817 A1* | 5/2013 | Saunier | H01L 29/778 257/77 |
| 2015/0129889 A1* | 5/2015 | Nakata | H01L 29/7784 257/76 |

FOREIGN PATENT DOCUMENTS

| JP | 2000-223697 A | 8/2000 |
|---|---|---|
| JP | 2006-261642 A | 9/2006 |

OTHER PUBLICATIONS

Kim et al., "Atomic layer deposition of GaN using $GaCl_3$ and $NH_3$," J. Vac. Sci. Technol. A 27(4), Jul./Aug. 2009, pp. 923-928.

* cited by examiner

*Primary Examiner* — Minh-Loan Tran
(74) *Attorney, Agent, or Firm* — Venable LLP; Michael A. Sartori; F. Brock Riggs

(57) ABSTRACT

A HEMT made of nitride semiconductor materials is disclosed. The HEMT includes the GaN channel layer, the InAlN barrier layer, and the n-type GaN regions formed beneath the source electrode and the drain electrode at a temperature such that the InAlN barrier layer in the crystal quality thereof is not degraded, lower than 800° C. The n-type GaN regions are doped with silicon (Si) and have a ratio of silicon atoms against carbon atoms (Si/C) greater than 100.

17 Claims, 8 Drawing Sheets

HIGH ELECTRON MOBILITY TRANSISTOR AND METHOD OF FORMING THE SAME USING ATOMIC LAYER DEPOSITION TECHNIQUE

BACKGROUND OF THE INVENTION

1. Field of the Invention

The present invention relates to a high electron mobility transistor (HEMT) and a process of forming the HEMT.

2. Background Art

A Japanese Patent document published as JP-2006-261642A has disclosed a field effect transistor (FET) and a method of forming the same. FIG. 8 schematically illustrates a cross section of the FET disclosed therein. The FET 100 provides a substrate 101 made of sapphire, and semiconductor layers formed on the substrate 101, where the semiconductor layers include a buffer layer 102 made of undoped gallium nitride (GaN) that forms a channel layer of the FET, an electron supply layer 103 made of n-type aluminum gallium nitride (AlGaN) provided on the buffer layer 102, and a cap layer 104 made of n-type indium-aluminum-gallium nitride (InAlGaN) provided on the electron supply layer 103. The FET further provides, on the n-type InAlGaN cap layer 104, ohmic electrodes 105 made of stacked metal of titanium (Ti) and aluminum (Al), where those electrodes 105 are a source electrode and a drain electrode of the FET 100.

A portion of the n-type InAlGaN cap layer 105 exposes a surface of the n-type AlGaN electron supply layer 103. A gate electrode 106, which is a stacked metal of palladium (Pa) and silicon (Si), is provided on the exposed surface of the n-type AlGaN electron supply layer 103. The gate electrode 105 makes a Schottky contact against the n-type AlGaN electron supply layer 103.

SUMMARY OF INVENTION

One aspect of the present invention relates to a high electron mobility transistor (HEMT) made of nitride semiconductor materials. The HEMT of the present invention provides at least a channel layer, a barrier layer, n-type regions, a source electrode, a drain electrode, and a gate electrode. The channel layer may be made of gallium nitride (GaN). The barrier layer may be made of indium aluminum nitride (InAlN). The n-type regions sandwich the barrier layer therebetween and penetrate into the channel layer. The source and drain electrodes are provided on the respective n-type regions, while, the gate electrode is provided on the barrier layer arranged between the n-type regions. A feature of the HEMT of the present invention is that the n-type regions are doped with silicon (Si) by a concentration ratio against carbon (Si/C) that is greater than 100.

Another aspect of the present invention relates to a method of forming the HEMT, which includes steps of (a) growing a buffer layer, a channel layer, and a barrier layer sequentially on a substrate; (b) forming recesses by etching portions of the barrier layer and the channel layer; and (c) filling the recesses by growing n-type regions therein by an atomic layer deposition (ALD) technique at a temperature lower than 650° C. but higher than 300° C. The n-type regions thus formed penetrate into the channel layer and sandwiching the barrier layer therebetween.

The barrier layer may be made of indium aluminum nitride (InAlN) grown at a temperature lower than 850° C. but higher than 650° C., while, the buffer layer, which may be made of aluminum nitride (AlN), and the channel layer, which may be made of gallium nitride (GaN), may be grown at a temperature higher than 1000° C. The ALD technique may iterate steps of growing a layer containing silicon (Si) by supplying only a source for a group III element concurrently with a dopant source and growing another layer not containing silicon (Si) by supplying only another source for a group V element. Or, in an alternative, the ALD technique may iterate steps of growing a layer containing Si by supplying only a source for the group III element, growing another layer not containing Si by supplying only another source for the group V element, and growing a still another layer by supplying only the dopant source. The source for the group III element may be tri-methyl-gallium (TEGa) or tri-chloro-gallium (GaCl$_3$), while, the dopant source may be silane (SiH$_4$).

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Figure 1:
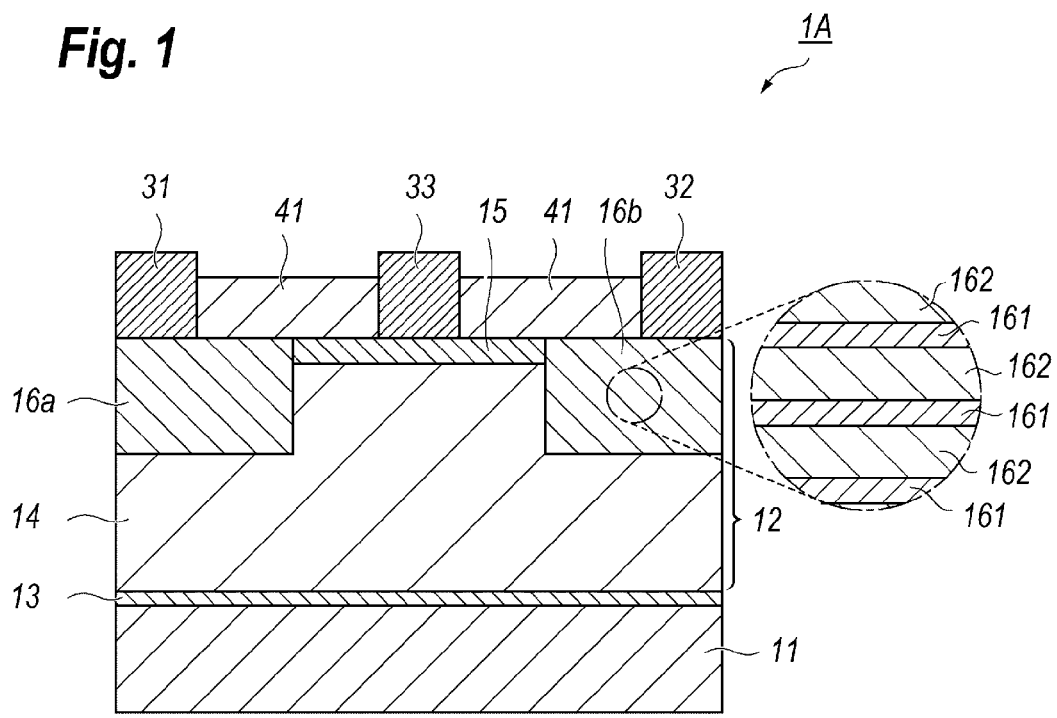
FIG. 1 schematically illustrates a cross section of a high electron mobility transistor (HEMT) according to embodiment of the present invention.

Nitride compound semiconductor materials, typically gallium nitride (GaN), are to be applied in a transistor operable in high frequencies under high biases because of wider bandgap energy inherently attributed thereto. In particular, a hetero-interface between a GaN layer and an AlGaN layer, or between a GaN layer and an InAlN layer, induces electrons in a high concentration in the hetero-interface, exactly, in the GaN layer adjacent to the hetero-interface. In order to enhance the high frequency performance of a transistor, namely, in order to increase a cut-off frequency thereof, the transistor is necessary to reduce parasitic capacitance and resistance around the gate electrode and to increase trans-conductance thereof. Reduction of access resistance between the source electrode and the gate electrode becomes effective to enhance the trans-conductance.

However, such reduction is practically hard. For instance, for a case of a HEMT made of gallium arsenide (GaAs)

related materials, a heavily doped n-type GaAs provided on the electron supply layer, which is usually made of AlGaAs, may effectively reduce the contact resistance against the source electrode formed on the n-type GaAs layer. While, for a HEMT made of gallium nitride related materials, when a heavily doped n-type GaN layer is formed on the electron supply layer made of InAlN and a source electrode on this n-type GaN layer, an interface between the n-type GaN layer and the InAlN electron supply layer may induce carries therein, which increases an energy difference between the bottom of the conduction band in the InAlN electron supply layer and the Fermi level therein, namely, this enhances a band-offset between the n-type GaN layer and the InAlN layer, which becomes a barrier for the carrier transportation and raises the resistance. Thus, the n-type GaN layer may reduce the contact resistance against the source electrode, but increase access resistance between the source electrode and the gate electrode.

A modified arrangement of a HEMT made of gallium nitride related materials may provide an n-type GaN layer so as to fill a hollow that reaches the channel layer under the InAlN electron supply layer, and the source electrode formed on this n-type GaN layer. In such an arrangement, the n-type GaN layer is directly in contact to the interface between the InAlN electron supply layer and the channel layer, where the two-dimensional electron gas (2DEG) is induced; accordingly, the HEMT having this arrangement may have reduced access resistance.

However, such a HEMT having the n-type GaN layer in the hollowed region of the channel layer inevitably has a subject to be solved. That is, the n-type GaN layer applicable to such HEMTs is necessary to be grown at a temperature higher than 1000° C. in order to enhance the doping density of n-type dopants, which is usually silicon (Si), as suppressing the capturing of carbons that operate as acceptors during the formation. A growth temperature higher than 1000° C. is comparable to a growth temperature for aluminum gallium nitrogen (AlGaN); accordingly, such an n-type GaN layer shows an advantage when the electron supply layer is made of AlGaN. On the other hand, indium aluminum nitride (InAlN) in the growth temperature thereof is strictly restructured to be lower than 1000° C., preferably around 800° C. When the growth temperature of InAlN reaches or exceeds around 1000° C., namely, InAlN is exposed in a temperature around 1000° C. or higher; desorption of indium (In) atoms and/or molecules from a surface of InAlN becomes substantial, which degrades crystal quality of the InAlN electron supply layer and resultantly the performance of HEMT.

Next some examples of the present invention will be described as referring to drawings. In the description of the drawings, numeral or symbols same with or similar to each other will refer to elements same with or similar to each other without duplicated explanations.

FIG. 1 schematically illustrates a cross section of a HEMT 1A according to one embodiment of the present invention. The HEMT 1A provides a substrate 11, a semiconductor stack 12, a source electrode 31, a drain electrode 32, and a gate electrode 33. The semiconductor stack 12, which may be made of nitride semiconductor materials, includes a buffer layer 13, a channel layer 14 made of gallium nitride (GaN), and a barrier layer 15 made of indium aluminum nitride (InAlN) sequentially stacked in this order on the substrate 11. The barrier layer 15 may cause the two dimensional electron gas (2DEG) in an interface against the GaN channel layer 14; accordingly, the InAlN barrier layer is equivalent to the electron supply layer disclosed in the prior document. The HEMT 1A further provides two n-type regions, 16a and 16b, which are made of GaN. The HEMT 1A may be covered with a protection film 41 in areas between the electrodes, 31 to 33. That is, the electrodes, 31 to 33, are directly in contact to the n-type GaN regions, 16a and 16b, and to the InAlN barrier layer 15 as passing respective openings provided in the protection film 41, and are connected to interconnections to supply biases to the source and drain electrodes, 31 and 32, and a control signal to the gate electrode 33.

The substrate 11, on which the semiconductor layers, 13 to 15, are to be epitaxially grown, may be made of silicon carbide (SiC), sapphire ($Al_2O_3$), silicon (Si), and so on. The buffer layer 13, which has a thickness of 10 to 300 nm, may be made of nitride semiconductor material containing aluminum (Al), such as aluminum nitride (AlN), aluminum gallium nitride (AlGaN), and so on. The channel layer 14, which may be made of gallium nitride (GaN), has a thickness of 400 to 1200 nm.

The barrier layer 15 has a thickness of 5 to 20 nm. The barrier layer 15 may induce electrons in the GaN channel layer 14 adjacent to the interface against the InAlN barrier layer 15 because of the polarization in the InAlN layer 15, where the induced electrons form the two-dimensional electron gas (2DEG) operating as the channel of the HEMT 1A. The InAlN barrier layer 15 may have an indium composition greater than 15% but less than 19%, where an InAlN material having those indium compositions has a lattice constant substantially matching with a lattice constant of gallium nitride (GaN). The HEMT 1A of the present embodiment has the InAlN barrier layer with the indium (In) composition of 17%.

Two n-type GaN regions, 16a and 16b, are formed within recesses formed by etching portions of the InAlN barrier layer 15 and the GaN channel layer 14. The n-type GaN regions, 16a and 16b, each has a depth greater than the thickness of the InAlN barrier layer 15 but smaller than a thickness of the InAlN barrier layer 15 added with the GaN channel layer 14. Thus, the n-type GaN regions, 16a and 16b, are in contact, or become continuous to the channel in the GaN channel layer 14 so as to put the channel and the InAlN barrier layer 15 therebetween. The n-type GaN regions, 16a and 16b, contain silicon (Si) with a great concentration exceeding $1 \times 10^{18}$ $cm^{-3}$; accordingly, those regions, 16a and 16b, are often called as heavily doped regions. Also, the doping density of the n-type GaN regions, 16a and 16b, is preferably less than $1 \times 10^{20}$ $cm^{-3}$ from a viewpoint of lattice quality; and have a depth of 80 to 200 nm.

The n-type GaN regions, 16a and 16b, may be formed by atomic layer deposition (ALD) technique different from other epitaxial layers, 13 to 15. The ALD technique may form those n-type GaN regions, 16a and 16b, at a temperature lower than, for instance, 650° C., which restricts a coupling of carbon with silicon in the dopant gas and within the reaction chamber of the apparatus, accordingly suppresses the capture of carbon atoms within the GaN regions, 16a and 16b. The n-type GaN regions, 16a and 16b, thus formed may show a ratio of the silicon against the carbon (Si/C) to be greater than 1000. Because carbons behave as acceptors in gallium nitride (GaN), a GaN layer grown by the ALD technique may show a high donor concentration; accordingly, low resistance. The ALD technique grows two type of layers alternately, one of which contains silicon (Si) with high density, while, the other contains substantially no silicon (Si).

The source, drain, and gate electrodes, 31 to 33, are provided on the surface of the semiconductor stack 12. The source electrode 31, which is provided on one of the n-type GaN regions 16a, makes ohmic contact to the n-type GaN region 16a; while, the drain electrode 32 makes the ohmic contact to the other n-type GaN region 16b. The present HEMT 1A provides the source and drain electrodes, 31 and 32, on surfaces of the n-type GaN regions, 16 and 16b, which are even with respect to the surface of the InAlN barrier layer 15. However, the source and drain electrodes, 31 and 32, may be provided on respective recesses formed in the surface of the n-type GaN regions, 16a and 16b. The gate electrode 33, which is provided between the source and drain electrodes, 31 and 32, is directly in contact to the InAlN barrier layer 15.

The protection film 41, which may be made of insulating inorganic material, such as silicon nitride (SiN), silicon oxide ($SiO_2$), silicon oxy-nitride (SiON), and so on, covers the surface of the semiconductor stack 12.

Next, a method of producing the HEMT 1A will be described as referring to FIGS. 2A to 4. The process first grows the buffer layer 13, the GaN channel layer 14, and the InAlN barrier layer 15 in this order on the substrate 11. Specifically, loading the substrate 11 within a growth chamber of the metal organized chemical vapor deposition (MOCVD) apparatus and supplying tri-methyl-aluminum (TMA) and ammonia ($NH_3$) as source materials for aluminum (Al) and nitrogen (N), the AlN buffer layer 13 is epitaxially grown on the substrate 11. The growth temperature may be, for instance, 1000 to 1200° C.; where the present embodiment sets the growth temperature to be 1080° C. Then, supplying tri-methyl-gallium (TMG) and ammonia ($NH_3$) and setting a temperature to be 1000 to 1100° C., for instance, 1080° C., the GaN channel layer 14 is grown on the AlN buffer layer 13. Furthermore, supplying tri-methyl-indium (TMI), TMA, and $NH_3$, and setting a temperature between 650° C. and 850° C., where the temperature is set in 800° C. in the present embodiment, the InAlN barrier layer 15 is grown on the GaN channel layer 14. Thus, the process may form an epitaxial substrate 51, which includes the AlN buffer layer 13, the GaN channel layer 14, and the InAlN barrier layer, on the substrate 11.

Figure 2A:
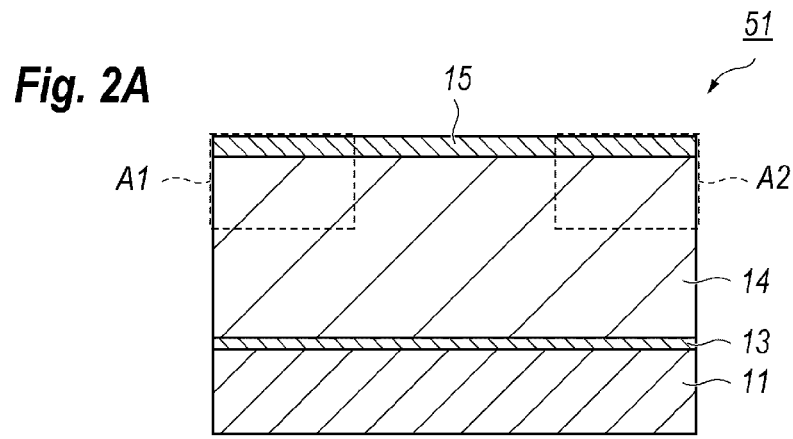
FIGS. 2A to 2C show processes of forming the HEMT shown in FIG. 1.
Figure 2B:
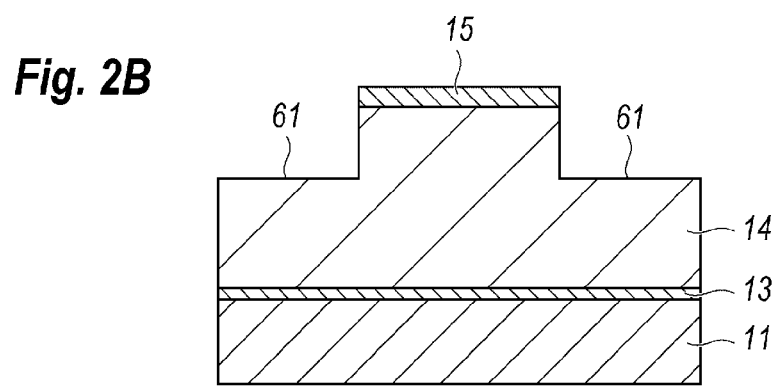

Then, the epitaxial substrate 51 is transferred to a reaction chamber of a dry-etching apparatus, where two regions, A1 and A2, in the GaN channel layer 14 and the InAlN barrier layer 15 are removed using chloride gasses as a reactive gas (FIG. 2A). The reactive ion etching (RIE) using chlorine gas ($Cl_2$) may etch the regions, A1 and A2, to form recesses 61 that pass the InAlN barrier layers 15 and reach the GaN channel layer as FIG. 2B illustrates.

Figure 2C:
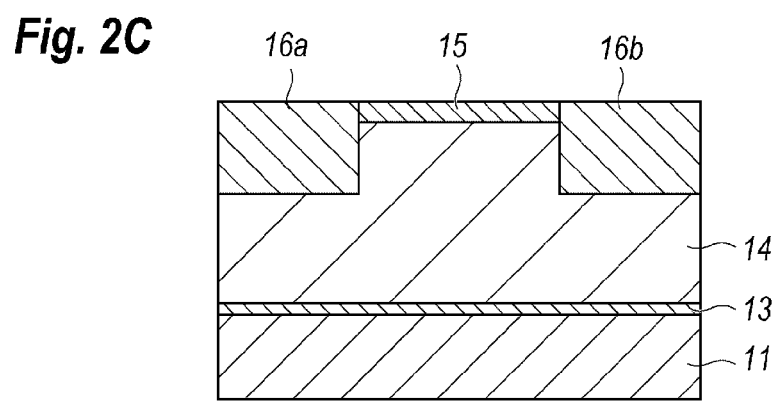

Then, the process transfers the epitaxial substrate 51 from the reaction chamber of the dry-etching apparatus to a chamber of the ALD apparatus. As FIG. 2C schematically illustrates, the n-type GaN regions, 16a and 16b, are selectively grown by the ALD technique on the bottom surfaces of the recesses 61 of the GaN channel layer 14, which are formed in the previous step shown in FIG. 2B. The n-type GaN regions are heavily doped with Si. The surface of the InAlN layer 15 is covered with an insulating material, such as silicon nitride (SiN) and/or silicon oxide ($SiO_2$); or, a mask made of such insulating material is formed in the step of forming the recesses 61 shown in FIG. 2B, and this mask is not removed in the next process, or remained on the InAlN barrier layer 15 in the process of the selective growth of the n-type GaN regions, 16a and 16b, subsequent to the formation of the recesses 61.

The ALD technique will be specifically described. Supply nitrogen (N) as a carrier gas and raising a temperature within a reaction chamber of the ALD apparatus to a temperature higher than 300° C. but lower than 650° C., where the present embodiment raises the temperature to 600° C., the growth of the n-type regions, 16a and 16b, may be carried out. Supplying tri-ethyl-gallium (TEGa) or tri-chloro-gallium ($GaCl_3$) as a source gas for gallium (Ga) and ammonia ($NH_3$) as a source gas for nitrogen (N) alternately, and silane ($SiH_4$) as a dopant gas, the n-type GaN regions, 16a and 16b, are selectively grown within the recesses 61.

Figure 3A:
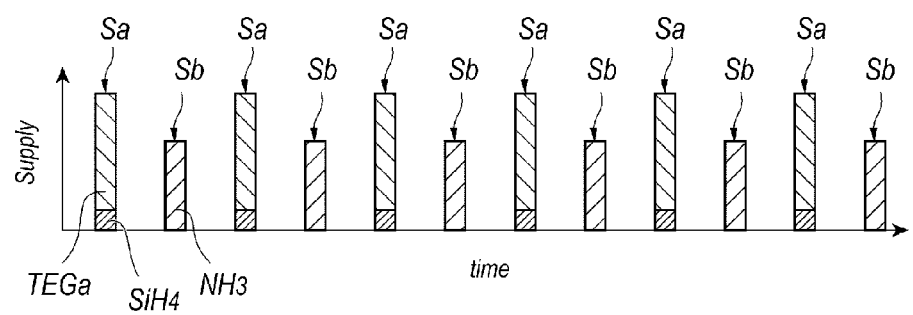
FIGS. 3A and 3B schematically illustrate diagrams of supplying sources for growing the n-type region according to first and second embodiment in the atomic layer deposition (ALD) technique of the present invention.
Figure 3B:
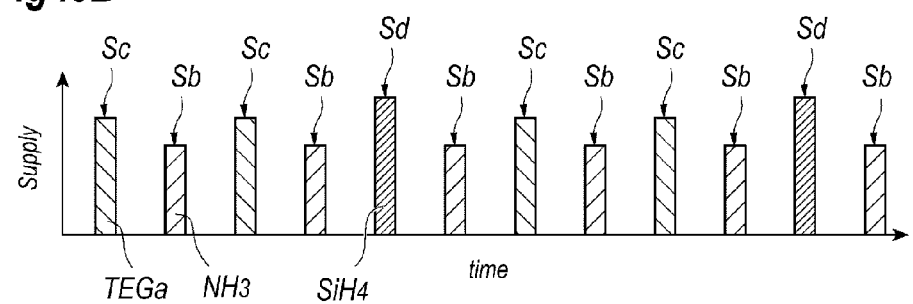

FIGS. 3A and 3B are diagrams describing the supply of the source gasses, where horizontal axes correspond to time and vertical axes show supply amount of the respective source gases. The ALD technique iterates steps Sa and Sb as FIG. 3A illustrates, where the step Sa supplies only the TEGa, or $GaCl_3$, namely the source gas for gallium (Ga), concurrently with silage ($SiH_4$); while, the step Sb supplies only $NH_3$, namely, the source gas for nitrogen (N). According to the process shown in FIG. 3A, the layers 161 indicated in the magnified view of FIG. 1, that contain Si, comprise Ga and Si; while, the other layers 162 not containing Si comprise only nitrogen N. All of steps Sa in FIG. 3A supply $SiH_4$ concurrently with TEGa; but only some of steps Sa may supply $SiH_4$ with TEGa.

Also, as FIG. 3B schematically illustrates, steps Sd that supply only $SiH_4$ may be independent of steps Sc that supply TEGa. This method, which is sometimes called as δ-doping, dopes silicon (Si) discretely and laterally. The layers 161 in FIG. 1 comprise only Si, while, the other layers 162 not containing Si comprise gallium layers and nitrogen layers stacked alternately. The steps Sd that supply only $SiH_4$ are preferably between the steps Sb that supply ammonia ($NH_3$) compared with cases where the steps Sc put the step Sd therebetween, or the step Sc and the step Sb put the step Sd.

The step Sa, or Sc, that supplies only TEGa, or $GaCl_3$, and the step Sb that supply only $NH_3$ preferably have a time to be 0.01 to 1 seconds. Also, the reaction chamber of the ALD apparatus is preferably purged by inactive gasses, typically nitrogen (N), at a switch between gas sources, from TEGa, or $GaCl_3$, to $NH_3$, and from $NH_3$ to TEGa, or $GaCl_3$. Accordingly, the step Sd that supplies only $SiH_4$ is preferably set between the steps Sb that supply only $NH_3$. Assuming that one cycle includes a step to supply TEGa, or $GaCl_3$, and another step to supply $NH_3$, the process may iterate 2000 to 8000 cycles to form the n-type GaN regions, 16a and 16b, with a thickness of 80 to 200 nm.

Figure 4:
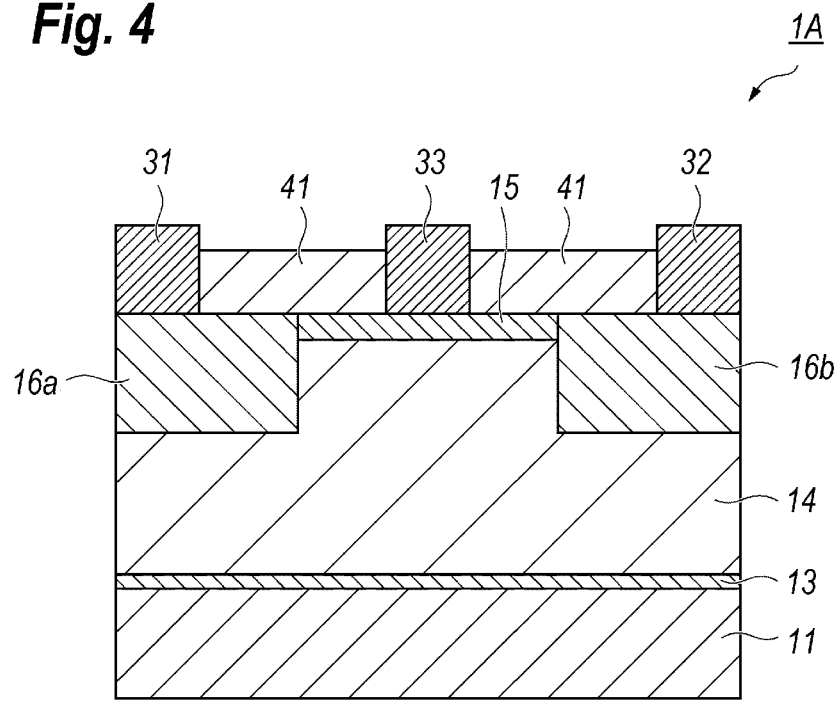
FIG. 4 shows a process of forming the HEMT subsequent to the process shown in FIG. 2C.

Next, the process forms the source electrode 31 on the n-type GaN region 16a, the drain electrode 32 on the other n-type GaN region 16b, and the gate electrode 35 on the InAlN barrier layer 15, as FIG. 4 schematically illustrates. Then, the protection film 41 covers surfaces of the InAlN barrier layer 15 exposed between the source and gate electrodes, 31 and 33, and between the drain and gate electrodes, 32 and 33. Thus, the HEMT 1A of the present embodiment may be obtained.

Next, advantages of the HEMT 1A thus formed and the process of forming the HEMT 1A will be described. In order to increase the density of silicon (Si) in GaN as the n-type dopant as suppressing the capture of carbon (C), the growth temperature of GaN is necessary to be higher than 1000° C. However, an InAlN layer exposed to those high temperatures exceeding 1000° C. easily dissolves indium (In) atoms from the surface thereof, which degrades the crystal quality and resultantly the performance of the HEMT 1A. In order to suppress or prevent the dissociation of In from the surface of the InAlN barrier layer 15, the temperature to which the InAlN layer is exposed is necessary to be, for instance lower than 800° C., at which the dissociation and the diffusion of In become substantially ignorable. However, such a lower temperature increases the capture of carbons accompanied with gallium in the n-type GaN region because the TEGa, the source gas for gallium, inherently contains carbons and a bond between carbon and gallium is hard to be dissolved at such a relatively restricted temperature below 800° C. Thus, an n-type GaN region or an n-type GaN layer doped with Si and grown at a temperature below 800° C. is almost impossible to show the electron concentration higher than $1 \times 10^{18}$ cm$^{-3}$ because of the increased carbon density therein.

The HEMT 1A of the present embodiment provides the n-type GaN regions, 16a and 16b, formed by the ALD technique at a temperature below 800° C. The ALD technique is a method using the surface adsorption and the reaction with atoms contained within the host layer as suppressing the surface dissociation by alternately supplying a source gas for a group III element and another source gas for a group V element. Accordingly, the ALD technique has a feature distinguishable from the MOCVD technique that the ALD technique may grow a layer at a temperature considerably lower than that often used in the MOCVD technique. Thus, the n-type GaN regions, 16a and 16b, may be formed without degrading the crystal quality of the InAlN barrier layer 15.

Also, the ALD technique of the present invention uses TEGa for the source gas of Ga, not tri-methyl-gallium (TMG) which is a very popular material in the MOCVD technique as a source gas for a semiconductor layer containing gallium (Ga). However, when a growth temperature is relatively lower, a grown layer inevitably contains residual carbons, which suppresses the electron concentration in the n-type GaN regions, 16a and 16b. The source gas of TEGa, or GaCl$_3$, of the present invention may reduce the residual carbons in the n-type GaN regions, 16a and 16b, and enhance the carrier concentration of the regions.

Figure 5A:
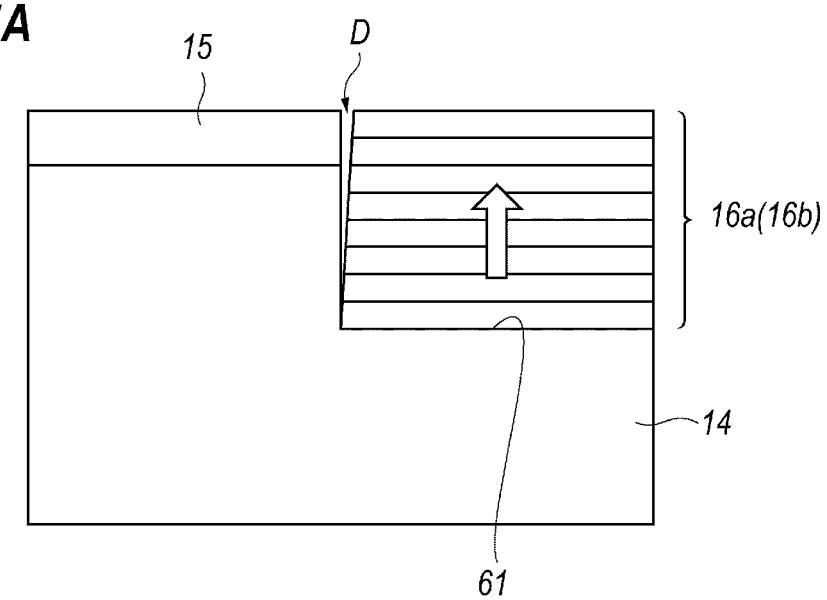
FIG. 5A schematically shows a behavior of growing a layer by the metal organized chemical vapor deposition (MOCVD) technique.
Figure 5B:
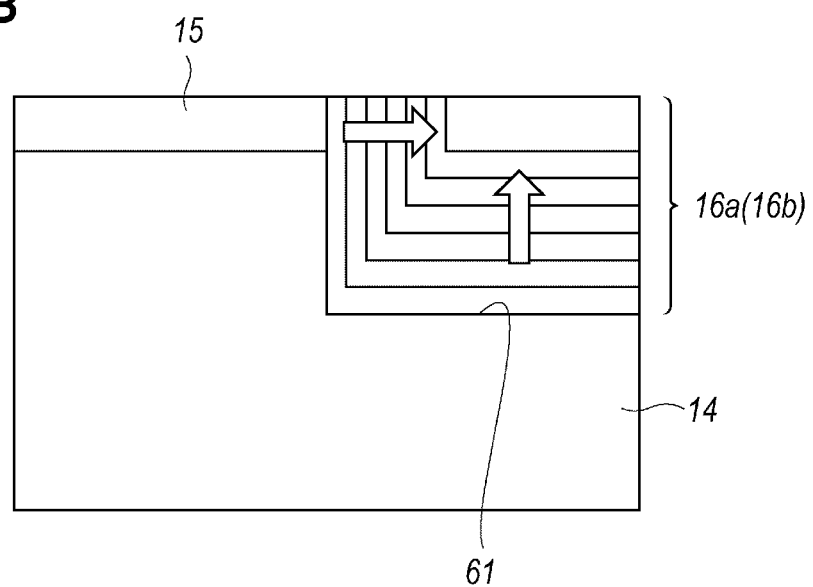
FIG. 5B shows a behavior of growing a layer by the ALD technique.

The HEMT 1A of the present embodiment may reduce the access resistance between the source electrode and the gate electrode because the n-type GaN region 16a, which is formed within the recess 61, is directly in contact to the side of the GaN channel layer 14 and that of the InAlN barrier layer 15. When the MOCVD technique grows the n-type GaN region 16a, as FIG. 5A illustrates, the n-type GaN region 16a often forms a gap against the side of the GaN channel layer 14 and that of the InAlN barrier layer 15 because the MOCVD technique restricts the growth on the side of the GaN channel layer 14 and that of the InAlN barrier layer 15. On the other hand, the ALD technique may inherently show an excellent coverage of the grown layer, that is, the growth on a side surface of a semiconductor layer and a top surface thereof may homogeneously advance without forming any gaps against the side of the GaN channel layer 14 and the InAlN barrier layer 15. Thus, the access resistance between the source electrode 31 and the gate electrode 33 may be effectively reduced. A situation same with those above may be applicable to the other n-type GaN region 16b and the other side of the GaN channel layer 14 and that of the InAlN barrier layer 15. Thus, the access resistance between the drain electrode 32 and the gate electrode 33 may be also reduced.

The growth temperature of the n-type GaN regions, 16a and 16b, may be lower than 650° C., which may further restrict the degradation of the crystal quality of the InAlN barrier layer 15. The ALD technique may inherently show a wide variety in the growth temperatures because the ALD technique independently forms respective elementary layers.

The ALD technique of the embodiment, as FIG. 3A indicates, iterates a supply of TEGa concurrently with SiH$_4$ and a supply of NH$_3$. Also, the ALD technique may supply TEGa, SiH$_4$ and NH$_3$ fully independent to each other as FIG. 3B indicates, which further reduce the sheet resistance of the n-type GaN regions, 16a and 16b. The recesses 61 into which the n-type GaN regions are grown may be formed by the dry-etching using a reactive gas containing chlorine (Cl).

Next, first and second embodiment according to the present invention will be described. The first embodiment adopts, in the growth of the n-type GaN regions, 16a and 16b, an algorithm indicated in FIG. 3A, that is, the supply of SiH$_4$ is concurrently with the supply of TEGa but independent of NH$_3$. Also, the second embodiment adopts another algorithm shown in FIG. 3B, where the supply of SiH$_4$ is independent of that of TEGa and that of NH$_3$, that is, three source gases are independently provided. A first example comparable to the present invention has a process that forms the source electrode 31 and the drain electrode 32 directly on the InAlN barrier layer 15 without forming the recesses 61 and re-growing the n-type GaN regions, 16a and 16b. Another example, which is also comparable to the present invention, provides the n-type regions, 16a and 16b, formed by the MOCVD technique.

First Embodiment

The first embodiment first grew the AlN buffer layer 13 by a thickness of 30 nm on the SiC substrate 11 by the MOCVD technique. Conditions of the MOCVD growth were a growth temperature of 1080° C., a growth pressure of 13.3 kPa, source gases of TMA and NH$_3$ for aluminum (Al) and nitrogen (N), respectively. Second, the GaN channel layer 14 was grown also by the MOCVD technique, where the growth conditions were the growth temperature of 1080° C., the growth pressure of 13.3 kPa, and source gases of TMG and NH$_3$ for gallium (Ga) and nitrogen (N), respectively. Third, the InAlN barrier layer 15 was grown on the GaN channel layer 14 by a thickness of 8 nm and an aluminum composition of 17%, where the MOCVD conditions were the growth temperature of 800° C., the growth pressure of 15.0 kPa, and source gases of TMI, TMA and HA$_{HN}$, for indium (In), aluminum (Al), and nitrogen (N), respectively. The InAlN barrier layer 15 thus grown had a lattice constant matching with a lattice constant of GaN.

Then, partially removing the InAlN barrier layer 15 and the GaN channel layer 14 by the RIE technique using a reactive gas containing chlorine (Cl), the recesses 61 with a depth of 80 nm was formed. The ALD technique formed the n-type GaN regions, 16a and 16b, with thicknesses of 120 nm within the recesses 61 under conditions of: the growth temperature of 500° C., the growth pressure of 1 kPa, and the doping source of SiH$_4$. The ALD technique iterated the supply of SiH$_4$ concurrent with the supply of TEGa and the supply of NH$_3$ according to the process shown in FIG. 3A. The n-type GaN regions, 16a and 16b, thus formed showed the silicon density of $5.0 \times 10^{18}$ cm$^{-3}$.

Then, the source and drain electrodes, 31 and 32, which were a stack of titanium (Ti) and aluminum (Al), are formed directly on the n-type GaN regions, 16a and 16b, respectively. Also, the gate electrode 33 made of stacked metal of nickel (Ni) and gold (Au) was formed directly on the InAlN barrier layer 15. Finally, the protection film 41 made of silicon nitride (SiN) covered portions of the InAlN barrier layer 15 exposed between the electrodes, 31 to 33, and metal interconnections each connected to the electrodes, 31 to 33, were formed on the protection film 41. Thus, the HEMT of the first embodiment was completed. The HEMT thus formed had a gate length and a distance between the source electrode 31 and the drain electrode 32 of 0.2 and 3.0 µm, respectively.

Second Embodiment

The second embodiment had the processes of forming the semiconductor stack 12 that includes the AlN buffer layer 13, the GaN channel layer 14, and the InAlN barrier layer 15 and the process of forming the recesses 61 same with those of the first embodiment. Then, the ALD technique formed the n-type GaN regions by the algorithm according to that shown in FIG. 3B. That is the ALD technique supplies TEGa, $NH_3$, and $SiH_4$ independent to each other under the growth temperature of 500° C. The n-type GaN regions, 16a and 16b, thus formed had a thickness of 120 nm and the silicon (Si) doping density of $1.0 \times 10^{19}$ cm$^{-3}$, which was one digit greater than that of the first embodiment. Then, the source, drain, and gate electrodes, 31 to 33, the protection film 41, and the interconnections were formed by the processes same with those of the first embodiment.

First Comparable Example

The processes from the beginning through the growth of the semiconductor stack 12 according to the first comparable example were same with those of the first and second embodiment described above including the growth conditions of the semiconductor layers, 13 to 15. Then, the electrodes, 31 to 33, of the source, drain and gate electrodes were formed directly on the InAlN barrier layer 15 without forming the recesses 61 and re-growing the n-type GaN regions, 16a and 16b. The processes subsequent to the formation of the electrodes, 31 to 33, were also same with those of the first and second embodiment described above.

Second Comparable Example

The processes, from the beginning through the formation of the recesses 61 in the InAlN barrier layer 15 and the GaN channel layer 14, according to the second comparable example were same with those of the first and second embodiment described above. Then, the MOCVD technique, not the ALD technique, filled the recesses 61 by the n-type GaN regions. The conditions of the MOCVD technique were the growth temperature of 1000° C., the growth pressure of 20.0 kPa, and the dopant source of $SiH_4$. The n-type GaN regions thus formed had a thickness of 120 nm and the silicon (Si) density of $5.0 \times 10^{18}$ cm$^{-3}$. The processes subsequent to the formation of the n-type GaN regions were substantially same with those of the aforementioned embodiment and the comparable example.

The HEMTs thus formed by the processes of the first and second embodiment, and the first and second comparable examples commonly had the gate length Lg of 0.2 µm and a distance of 3.0 µm between the source electrode and the drain electrode.

Comparison of HEMTs

The HEMTs of the embodiment and those of the comparable examples were evaluated by supplying a drain bias of 10 V and a drain current of 200 mA/mm by adjusting gate biases. DC parameters and RF performances through S-parameters were evaluated. The HEMT according to the first embodiment showed a cut-off frequency ft of 110 GHz and trans-conductance gm of 550 mS/mm; while the HEMT of the second embodiment enhanced the performance thereof, specifically, the cut-off frequency ft of 145 GHz and the trans-conductance gm of 720 mS/mm. On the other hand, the HEMT of the first comparable example exhibited the cut-off frequency ft of 80 GHz and the trans-conductance gm of 400 mS/mm, and the last HEMT of the comparable example showed the cut-off frequency ft of 90 GHz and the trans-conductance gm of 450 mS/mm.

Figure 6:
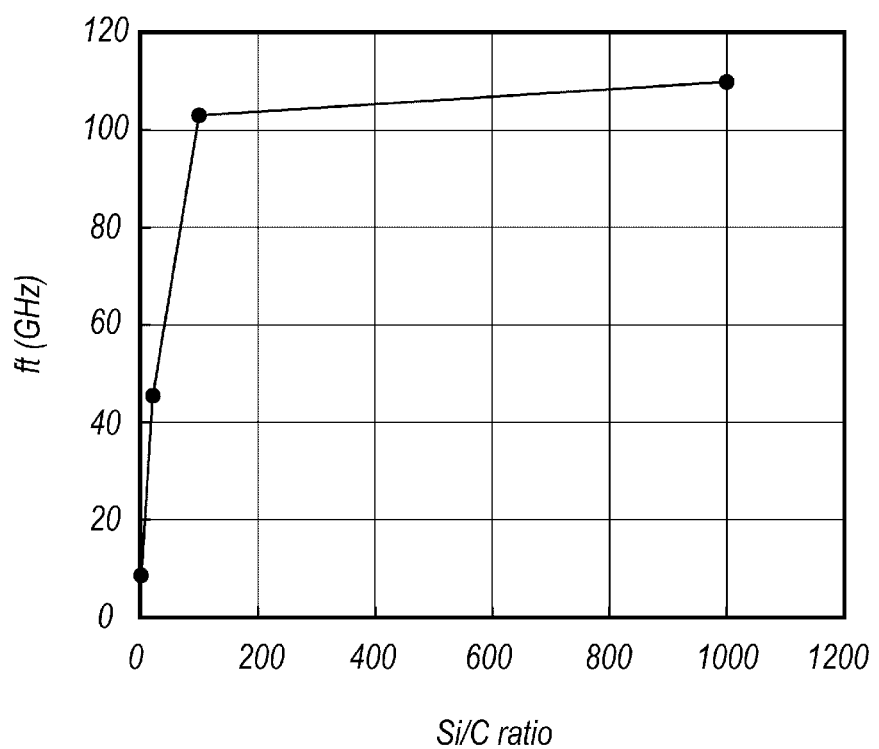
FIG. 6 shows a behavior of a cut-off frequency against a concentration ratio of silicon to carbon (Si/C) of a HEMT formed by the first embodiment of the present invention.
Figure 7A:
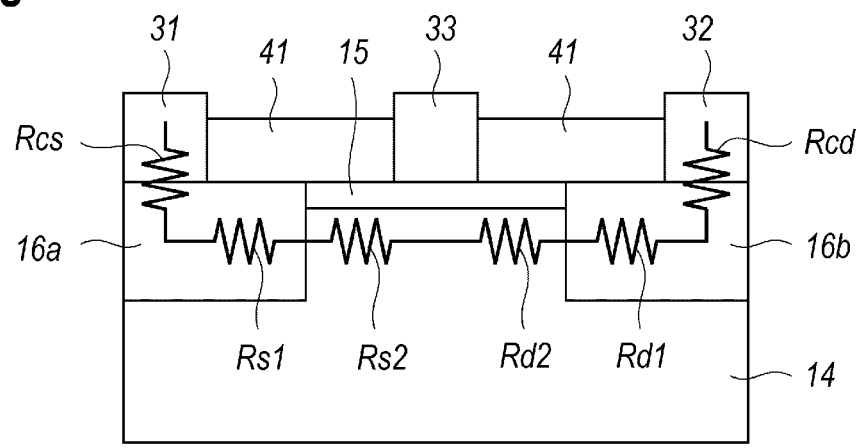
FIGS. 7A and 7B schematically indicate the contact resistance, the sheet resistance, and the channel resistance of the HEMT according to the embodiment of the present invention and the first example comparable to the present invention, respectively.
Figure 7B:
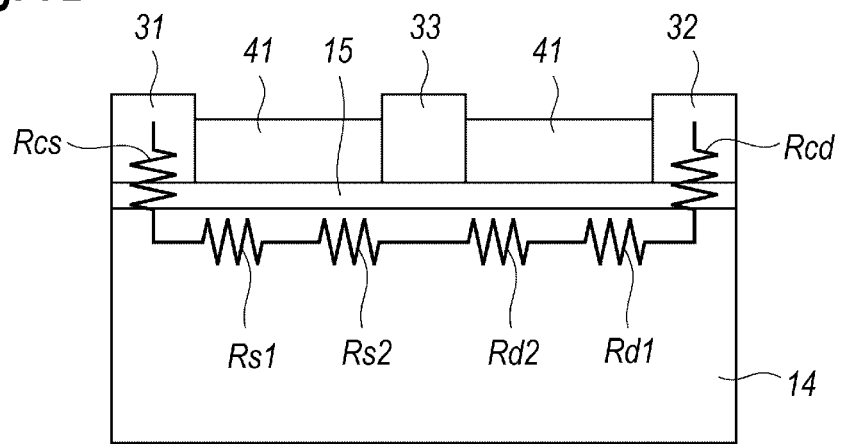
Figure 8:
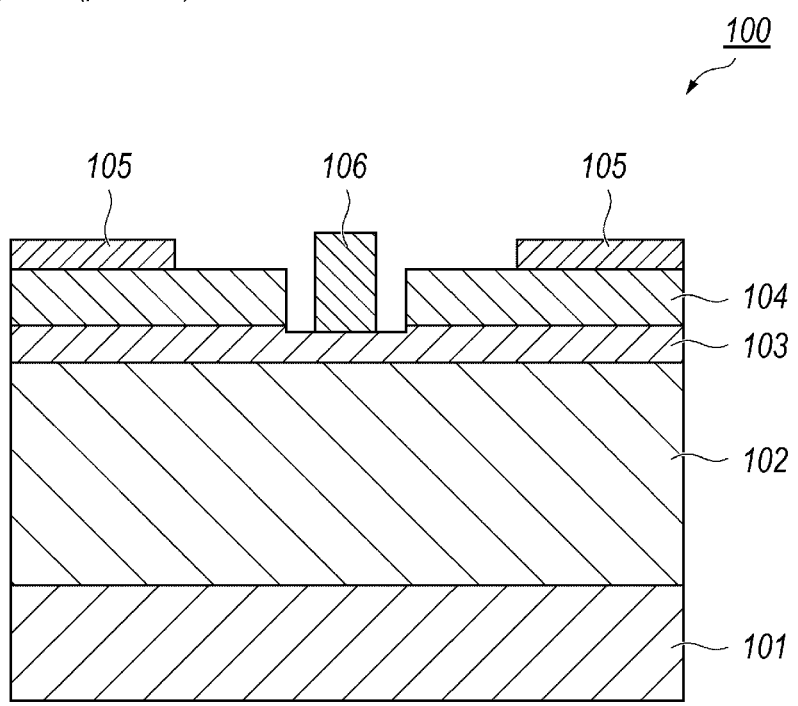
FIG. 8 schematically illustrates a cross section of a HEMT disclosed in the prior patent document.

FIG. 6 shows a behavior of the cut-off frequency ft of the HEMT against the ratio of silicon to carbon (Si/C) in the n-type GaN regions, where the HEMTs are formed according to the first embodiment. When the ratio (Si/C) exceeds 100, the cut-off frequency ft saturated exceeding 100 GHz, and reached about 110 GHz when the ratio (Si/C) becomes 1000.

A table below summarizes the contact of the source and drain electrodes against the n-type GaN regions, series resistance primarily due to the n-type GaN regions, and channel resistance primary due to the GaN channel layer in the unit of sheet resistance ($\Omega/\square$) and practical resistance ($\Omega \cdot$mm), respectively. The access resistance in the right end column is a sum of practical resistance.

| | contact resistance Rcs, Rcd | series resistance Rs1, Rd1 | channel resistance Rs2, Rd2 | access resistance |
|---|---|---|---|---|
| Example 1 | | | | |
| sheet resistance ($\Omega/\square$) | | 300 | 300 | |
| practical resistance ($\Omega$mm) | 0.6 | 0.15 | 0.15 | 1.8 |
| Example 2 | | | | |
| sheet resistance ($\Omega/\square$) | | 200 | 600 | |
| practical resistance ($\Omega$mm) | 0.4 | 0.1 | 0.3 | 1.6 |
| Embodiment 1 | | | | |
| sheet resistance ($\Omega/\square$) | | 200 | 300 | |
| practical resistance ($\Omega$mm) | 0.4 | 0.1 | 0.15 | 1.3 |
| Embodiment 2 | | | | |
| sheet resistance ($\Omega/\square$) | | 100 | 300 | |
| practical resistance ($\Omega$mm) | 0.3 | 0.05 | 0.15 | 1.0 |

The first comparable example, where the n-type regions were omitted and the electrodes were directly in contact to the InAlN barrier layer 15, showed the channel resistance comparable to other cases. However, because of the omission of the n-type regions, the contact resistance and the series resistance thereof became larger. Accordingly, the access resistance was left high, which is the primary reason why the HEMT of the first comparable example showed lesser cut-off frequency ft and the smaller trans-conductance gm.

For the second comparable example in the second row, because of the existence of the n-type GaN regions, the contact resistance and the sheet resistance became smaller compared with those of the first example. However, the channel resistance remarkably increased because the process of forming the n-type GaN regions raised the growth temperature thereof and the InAlN barrier layer exposed to such raised temperature degraded the crystal quality thereof, which increased the channel resistance. The access resistance thereof lowered to 1.6 $\Omega$mm and the HEMT of the second example showed performances slightly improved from those of the first comparable example.

Referring to the HEMT of the first embodiment shown in the third row, the n-type GaN regions, 16a and 16b, grown at relatively lower temperature (500° C.) remarkably reduced the contact resistance and the sheet resistance without increasing the channel resistance. That is, even the contact resistance and the sheet resistance thereof were comparable to those of the second comparable example in the second row, the increase of the channel resistance was effectively suppressed to those comparable to the first comparable example.

Accordingly, the total access resistance became 1.3 Ωmm, which is improved by about 20% from the second comparable example.

The HEMT of the second embodiment shown in the lowermost row further improved the contact resistance and the sheet resistance, which reduced the practical resistance half of the first comparable example shown in topmost row. This is because the n-type GaN regions, 16a and 16b, formed by the ALD technique by supplying the gallium source, the nitrogen source, and the silicon source independent to each other. Thus, the contact resistance and the sheet resistance further decreased, specifically, the contact resistance became 75% and the sheet resistance became half of those of the first embodiment show in the third row. The cut-off frequency ft and the trans-conductance gm may be further improved.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

The present application claims the benefit of priority of Japanese Patent Application No. 2015-183069, filed on Sep. 16, 2015, which is incorporated herein by reference.

I claim:

1. A high electron mobility transistor (HEMT), comprising:
   a channel layer made of gallium nitride (GaN);
   a barrier layer made of indium aluminum nitride (InAlN), the barrier layer being provided on the channel layer;
   n-type regions sandwiching the barrier layer therebetween, the n-type regions penetrating into the channel layer and being doped with silicon (Si) by a concentration ratio against carbon (Si/C) greater than 100;
   a source electrode and a drain electrode each provided on the n-type regions; and
   a gate electrode provided on the barrier layer.

2. The HEMT of claim 1,
   wherein the n-type regions have the concentration of Si greater than $1.0 \times 10^{18}$ cm$^{-3}$.

3. The HEMT of claim 2,
   wherein the n-type regions have the concentration of Si less than $1.0 \times 10^{20}$ cm$^{-3}$.

4. The HEMT of claim 1,
   wherein the n-type regions each includes layers containing silicon (Si) and other layers not containing silicon (Si) alternately stacked with respect to the layers containing silicon (Si).

5. The HEMT of claim 1,
   wherein the barrier layer has a thickness of 5 to 20 nm and the n-type regions have depths of 80 to 200 nm.

6. The HEMT of claim 1,
   wherein the barrier layer has a lattice constant substantially matching with a lattice constant of the channel layer.

7. The HEMT of claim 6,
   wherein the InAlN of the barrier layer has an indium (In) composition of 15 to 19% against aluminum (Al).

8. A method of producing a high electron mobility transistor (HEMT), comprising steps of:
   growing a buffer layer, a channel layer, and a barrier layer sequentially on a substrate, where the buffer layer, the channel layer and the barrier layer are made of nitride semiconductor materials included in group III-V compound semiconductors, the barrier layer including indium (In);
   forming recesses by etching portions of the barrier layer and the channel layer; and
   filling the recesses by growing n-type regions therein by an atomic layer deposition (ALD) technique at a temperature lower than 650° C. but higher than 300° C., the n-type regions penetrating into the channel layer and sandwiching the barrier layer therebetween.

9. The method of claim 8,
   wherein the step of filling the recesses includes steps of:
   growing a layer by supplying a source only for a group III material concurrently with a dopant source;
   growing another layer by supply another source only for a group V material; and
   iterating steps of growing the layer and growing the another layer.

10. The method of claim 9,
    wherein the step of glowing the layer is carried out by supplying only tri-ethyl-gallium (TEGa) or tri-chloro-gallium (GaCl$_3$) concurrently with silane (SiH$_4$) as the dopant source.

11. The method of claim 9,
    wherein the step of iterating the steps includes iteration greater than 2000 cycles.

12. The method of claim 9,
    wherein the steps of growing the buffer layer and the channel layer are carried out at a temperature higher than 1000° C., and the step of growing the barrier layer is carried out at another temperature higher than 650° C. but lower than 850° C.

13. The method of claim 9,
    wherein the step of filling the recesses includes a step of growing the n-type regions at a temperature of 500° C.

14. The method of claim 8,
    wherein the step of filling the recesses includes steps of:
    growing a layer by supplying a source only for a group III material concurrently with a dopant source;
    growing another layer by supply another source only for a group V material;
    growing still another layer by supplying only dopant source; and
    iterating steps of growing the layer, the another layer, and the still another layer.

15. The method of claim 14,
    wherein the step of growing the sill another layer is intermittently interposed within the steps of growing the layer and the steps of growing the another layer.

16. The method of claim 15,
    wherein the step of growing the still another layer is interposed between the steps of growing the another layer.

17. The method of claim 14,
wherein the step of growing the layer is carried out by supplying only tri-ethyl-gallium (TEGa) or tri-chloro-gallium ($GaCl_3$), and
wherein the step of growing the still another layer is carried out by supplying silane ($SiH_4$).

\* \* \* \* \*